United States Patent [19]

Stoops

[11] Patent Number: 4,808,858
[45] Date of Patent: Feb. 28, 1989

[54] DUAL LIMIT PROGRAMMABLE LINEAR SIGNAL LIMITER

[75] Inventor: John F. Stoops, Portland, Oreg.
[73] Assignee: Tektronix, Inc., Beaverton, Oreg.
[21] Appl. No.: 148,253
[22] Filed: Jan. 25, 1988
[51] Int. Cl.[4] ............................................. H03K 5/08
[52] U.S. Cl. .................... 307/544; 307/551
[58] Field of Search .............. 307/540, 544, 549, 551, 307/555, 559, 558, 560, 561, 565; 328/169, 172

[56] References Cited

U.S. PATENT DOCUMENTS 3,555,299 1/1971 Millward ............................ 328/169

Primary Examiner—John Zazworsky
Attorney, Agent, or Firm—Peter J. Meza

[57] ABSTRACT

A current signal limiter provides precise minimum and maximum current limiting. Both maximum and minimum current limits are easily programmable. The signal limiter operates at maximum frequency response without inversion of the input signal. Current signal limiting is achieved by an NPN transistor biased in a common base configuration with the base coupled to a reference voltage source and the collector providing the output current, a series diode coupled to the emitter of the transistor for receiving a trickle current which prevents the transistor from turning off as well as setting a minimum current limit, and a diode matrix for receiving two reference currents and an input current. The diode matrix steers the input and reference currents to the transistor or to the reference voltage source, depending on the magnitude of the input and reference currents. The minimum and maximum current limits are programmable by adjusting the values of the reference currents and the trickle current.

3 Claims, 2 Drawing Sheets

DUAL LIMIT PROGRAMMABLE LINEAR SIGNAL LIMITER

BACKGROUND OF THE INVENTION

This invention is in the field of signal limiters, and relates more specifically to current limiters having programmable upper and lower current limits, and an intermediate linear range.

Several prior art approaches are available for signal limiting. One approach is adapted to a differential transistor pair amplifier and is shown in FIG. 1. The differential transistor amplifier consists of emitter coupled transistors 14 and 16, bias current source 18, and load resistors 10 and 12. The amplifier is coupled between $V_{CC}$ and $V_{EE}$, two sources of supply voltage. The amplifier is driven by a differential input voltage ($+V_{IN}$, $-V_{IN}$) and the output voltage is developed across the collectors of transistors 14 and 16. The limiting circuitry consists of diode strings 20, 22 and 24, and 26, 28, and 30. Due to the clamping action of the diodes in the limiting circuitry, the maximum differential output voltage of the amplifier is limited to three diode drops above the quiescent output voltage whereas the minimum differential output voltage is limited to three diode drops below the quiescent output voltage.

This approach has several disadvantages. The amount of signal limiting is constrained to discrete values determined by the number of diodes used in the diode strings. Further, the clamping action is not sharp and precise, but determined by the diode voltage and current characteristics which produce a soft, poorly determined clamping point. The clamping point, since it is determined by the diode characteristics is also sensitive to changes in temperature. Also, this prior art signal limiting technique is only useful for voltage signal limiting, and is not suited to current signal limiting. Finally, this approach cannot be directly adapted to single ended amplifiers.

An improved prior art signal limiting circuit is shown in FIG. 2. The differential amplifier is identical to the one shown in FIG. 1, with the exception of the signal limiting circuit. The signal limiting circuit consists of diodes 32 and 34, and diodes 36 and 38. The diodes are coupled to the collectors of transistors 14 and 16, and are also coupled to reference voltages $V_1$ and $V_2$. This signal limiting circuit limits the voltage at the collectors of transistors 14 and 16 to a maximum of one diode drop above $V_2$ and to a minimum of one diode drop below $V_1$. This technique is not limited to discrete amounts of signal limiting, since the reference voltages $V_1$ and $V_2$ may be adjusted to any voltage which is desired. This technique may also be adapted to single ended amplifiers. However, all the other disadvantages of the limiting circuit shown in FIG. 1 remain.

A prior art current limiting approach is shown in FIG. 3. This approach is used mainly in output stages wherein transistor 40 is an output signal device used to deliver output load current. As the output current increases, a voltage is developed across resistor 44. As this voltage increases transistor 42 begins to conduct, steering base current away from transistor 40 and thus limiting the output current of transistor 40. Although this approach is used for current limiting, it suffers from many of the same disadvantages of the previous two prior art techniques. The clamping point occurs when the voltage across resistor 44 is sufficient to enable transistor 42 to conduct. This clamping point is not precisely defined due to the soft conduction characteristics of the emitter base junction of transistor 42. Further, the input and output currents are related by the beta of transistor 40 which adds further imprecision and temperature sensitivity to the clamping point of the signal limiting circuitry.

One final prior art current limiting approach is shown in FIG. 4 which does not have the disadvantages associated with the soft conduction characteristics of a diode. The circuit consists of a reference current 46 which is labeled $I_{REF}$, an input NPN transistor 52, an output PNP transistor 50, and a diode 48. For an input current $I_{IN}$ of zero, a maximum current output current is developed equal to the reference current $I_{REF}$. The polarity of the emitter base junction of transistor 50 turns diode 48 off. As $I_{IN}$ increases slightly, a corresponding decrease in the output current will be developed. The input current and output current are thus linearly related, although the polarities are inverted. The linear region continues until the input current is equal to or exceeds the reference current. In this limiting mode, the output current of transistor 50 is zero, with the current demands of transistor 52 being provided by the reference current $I_{REF}$ and the excess by the reference voltage $V_{REF}$, through diode 48. This approach has several disadvantages. The inversion between the input current and the output current may not be desirable. Also, the minimum input current limit is fixed at zero. Finally, the introduction of the PNP transistor adversely affects the frequency response of the circuit when fabricated with readily available integrated circuit processes.

Therefore, what is desired is a signal current limiting circuit which has all NPN transistor circuitry for maximum frequency response, a precisely defined minimum input current limit as well as a precisely defined maximum input current limit, linear operation when not in a current limit mode, equal polarity input and output current, and adaptability to single ended or differential amplifiers.

SUMMARY OF THE INVENTION

According to the present invention, a signal limiter includes an NPN transistor biased in a common base configuration with the base coupled to a reference voltage source and the collector providing the output current, a series diode coupled to the emitter of the transistor for receiving a trickle current which prevents the transistor from turning off as well as setting an output current offset, and a diode matrix for receiving two reference currents and an input current. The diode matrix steers the input and reference currents to the transistor or to the reference voltage source, depending on the magnitude of the input and reference currents. The minimum and maximum input current limits are programmable by the values of the reference currents, and are not a function of diode or transistor base emitter voltages.

An alternative embodiment includes an NPN transistor biased in a common base configuration with the base coupled to a reference voltage source and the collector providing the output current, and a diode matrix for receiving two reference currents and an input current. As in the first implementation, the diode matrix steers the input and reference currents either to the transistor or to the reference voltage source, depending on the magnitude of the input and reference currents. The maximum and minimum input current limits are programmable by the values of the reference currents, and are not a function of diode or transistor bas emitter voltages.

Circuit analysis shows, and computer simulations confirm that the signal limiter according to the present invention provides precise minimum and maximum input currents limits which are programmable through the magnitude of the reference currents, has linear operation when not in the current limit mode, while maintaining maximum operating frequency without inversion between input and output currents. The current signal limiter is adaptable to both single ended and differential amplifiers.

Thus, the present invention provides an output current which is linear within a limited specific range, although the input current range may be considerably larger. This limiting function is desirable since succeeding amplifiers need only act on the limited output signal without being overdriven or having to accommodate the full dynamic range of the original input signal.

DESCRIPTION OF THE PREFERRED EMBODIMENT

Figure 1:
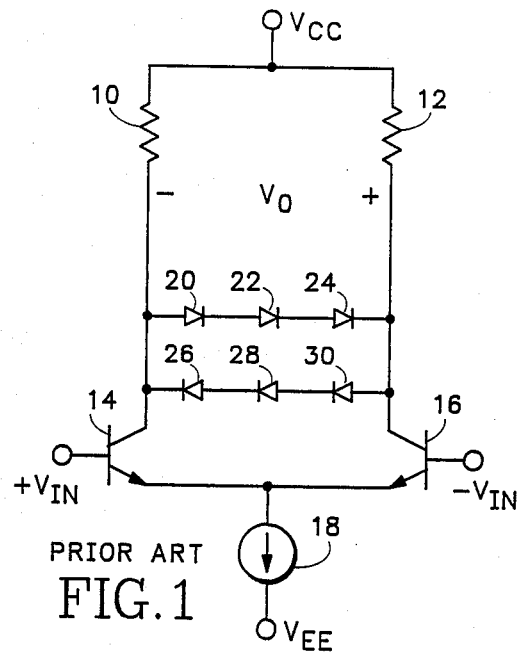
FIG. 1 is a schematic diagram of a differential amplifier which includes a prior art voltage signal limiter.
Figure 3:
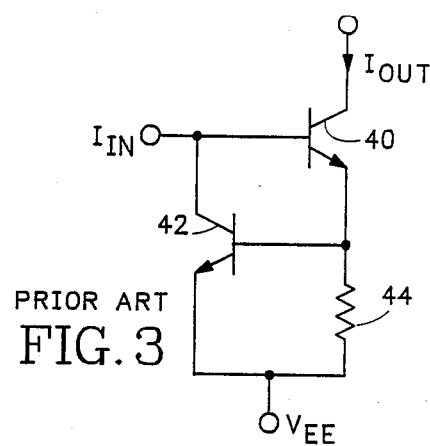
FIG. 3 is a schematic diagram of a prior art current signal limiter.
Figure 4:
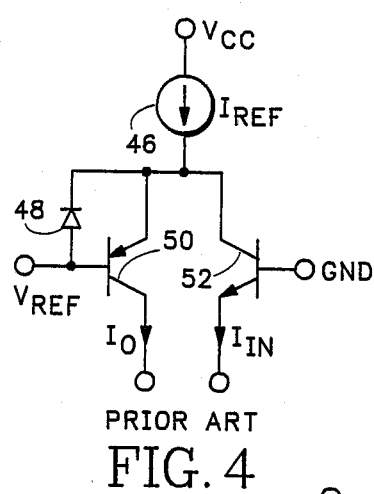
FIG. 4 is a schematic diagram of a current steering type prior art current signal limiter.
Figure 2:
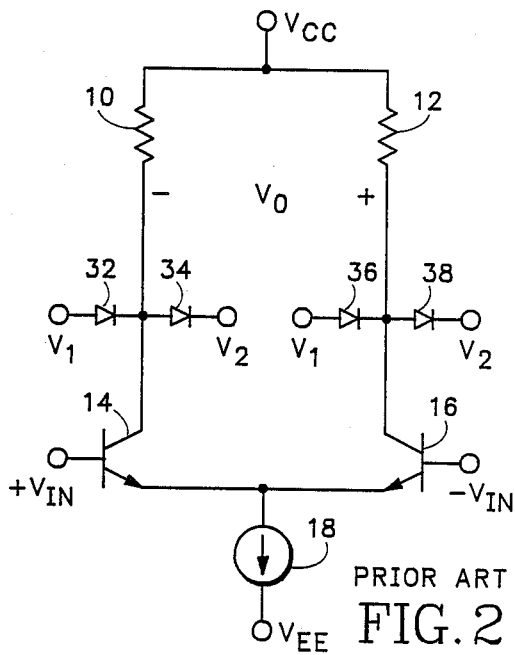
FIG. 2 is a schematic diagram of a differential amplifier which includes an alternative prior art voltage signal limiter.
Figure 5:
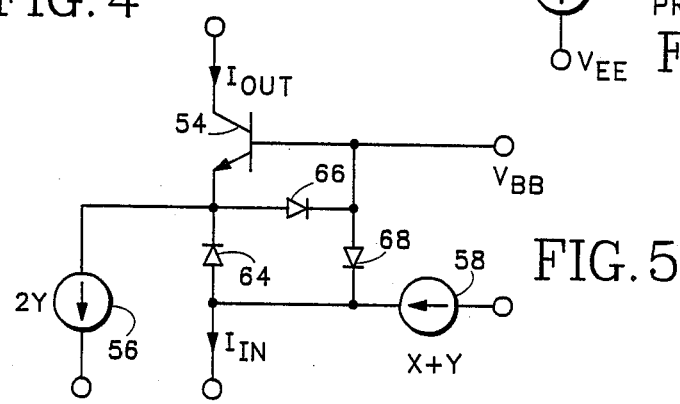
FIG. 5 is a schematic diagram of a first embodiment of the signal limiter according to the present invention.

A first embodiment of the signal limiter is shown in FIG. 5 which includes an NPN transistor 54, first and second reference currents 56 and 58, and a diode matrix including diodes 64, 66 and 68. The junction of diodes 64 and 68 with reference current 58 form the port for the input current. The collector of transistor 54 provides the output current, and the base of transistor 54 is biased to an appropriate intermediate reference voltage.

The operation of the first embodiment of the signal limiter may be understood by assigning a value of "2y" units of current to first reference current 56, and "x+y" units of current to second reference current 58. The designations of x and y refer to any positive value of current provided that x has a greater positive value than y. It should be noted that the term "input current limit" refers to the value of the input current at which the output current is limited. The input current itself, of course, is not limited. The term "output current limit" refers to the actual value of the limited output current.

The first embodiment of the signal limiter has a programmable minimum input current limit, a programmable maximum current limit, and an intermediate linear region. To analyze the first minimum current limit, assume that the input current is less than the value of x−y. This value of input current may be designated as x−y−dI for convenience of analysis. Given this value of input current and the value of the second reference current 58, the difference between the two currents is −2y+dI which flows through diode 64. The first reference current diminishes this value by 2y and the remainder of the current, dI, flows through diode 66. Since diodes 64 and 66 are both conducting, diode 68 and the emitter base junction of transistor 54 are reverse biased. Consequently, no output current is produced at the collector of transistor 54.

In the programmable maximum input current limit code, assume that the input current has a value of x+y+dI. In this mode, the difference of the input current and the second reference current 58, is simply dI. This current flows through diode 68 from the reference voltage source $V_{BB}$. Since diode 68 is conducting diodes 64 and 66 are reverse biased and not conducting. Transistor 54 is actively biased by the first reference current 56. Therefore the output current is simply 2y, and this is the maximum output current available.

In the intermediate linear mode, assume that the input current has a value of x−y+dI, where dI is less than 2y. In this mode, the difference of the input current and the second reference current 58, is 2y−dI. This current flows through diode 64. Since the value of the first reference current 56 is 2y, transistor supplies the remaining current needed, dI. Since transistor 54 and diode 64 are actively biased, diodes 66 and 68 are not conducting. Thus, the output signal current is dI which is linearly related to the input signal current, x−y+dI, and possesses the same polarity.

Figure 6:
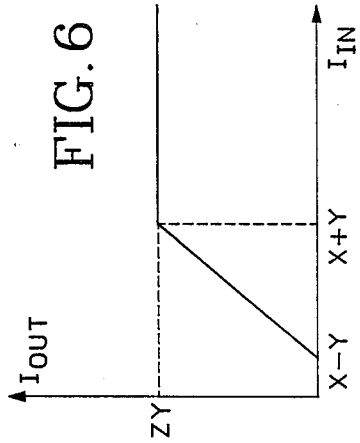
FIG. 6 is a plot of output current versus input current of the first embodiment of the signal limiter showing both input and output current limits.

A plot illustrating the three modes of the signal limiter is shown in FIG. 6. The programmable minimum input current limit is achieved if the input current is less than x−y, the linear region is achieved for input currents between x−y and x+y, and the programmable maximum input current limit is achieved for input currents in excess of x+y.

Figure 8:
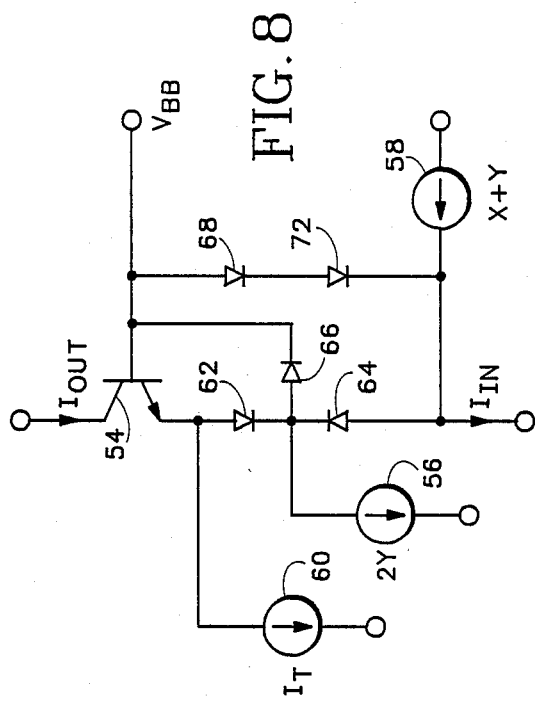
FIG. 8 is an alternative second embodiment of the signal limiter.

The signal limiter of FIG. 5 achieves precise minimum and maximum current limiting in an all NPN design, but may be improved by an alternative embodiment. In the minimum current limit, transistor 54 is cut off which adversely impacts the operating speed. To improve the performance of the first embodiment, two versions of a second embodiment are shown in FIGS. 7 and 8.

Figure 9:
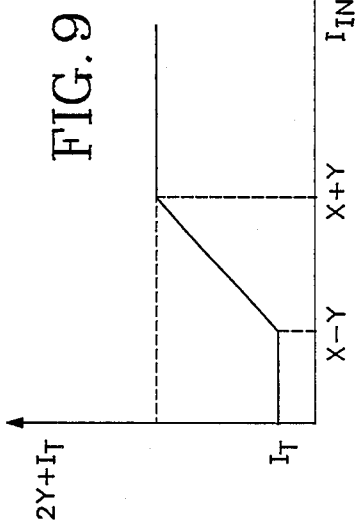
FIG. 9 is a plot of output current versus input current of the second embodiment of the signal limiter showing both input and output current limits.
Figure 7:
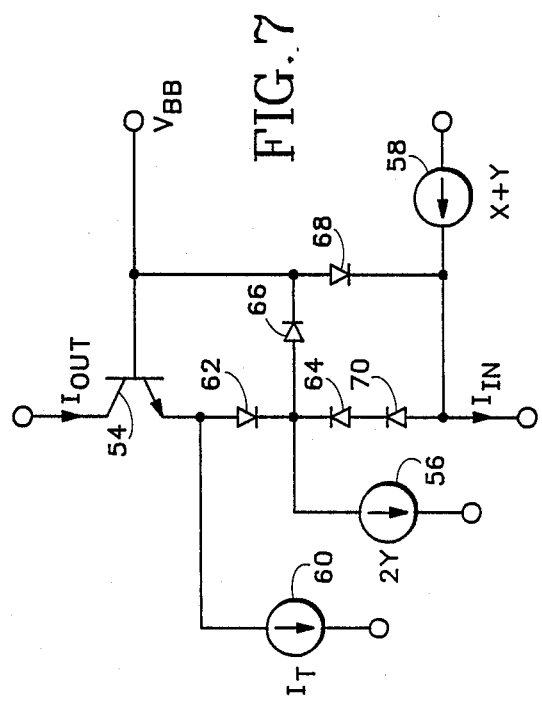
FIG. 7 is a schematic diagram of a second embodiment of the signal limiter according to the present invention.

The signal limiter in FIG. 7 operates in much the same manner as the first embodiment shown in FIG. 5. However, an additional series diode 62 and a trickle current source 60 are added. The function of these two circuit elements is to ensure that transistor 54 is always actively biased to achieve maximum frequency response. The additional trickle current 60 may be adjusted to an extremely low value if the only purpose is to keep transistor 54 actively biased. However trickle current 60 may also be adjusted to some higher level if an output offset current is desired. The input and output current transfer curve of the second embodiment is shown in FIG. 9. There are three regions as in the first embodiment, but the output current now ranges between $I_T$ and $2y+I_T$, with both minimum and maximum input current limits being fully programmable through the adjustment of the values of reference currents 56 and 58.

The introduction of series diode 62 necessitates a slight change in the circuit topology to assure proper biasing. Specifically, in the linear mode, the introduction of diode 62 and trickle current 60 would cause diode 68 to conduct and thus destroy the linear characteristics. Assuming the series diode being inserted into the first embodiment of FIG. 5, the total voltage drop across diode 68 includes the emitter base junction voltage of transistor 54, the voltage drop across the series diode 62, and the voltage drop across diode 64. This total drop equals one forward biased diode which is enough to forward bias diode 68. To prevent this from occurring, an additional diode is inserted. In FIG. 7, additional diode 70 introduces an inverted diode drop sufficient to turn off diode 68. In FIG. 8, additional diode 72 provides the same function.

Thus, it has been shown that an all NPN current signal limiter provides current limiting using only current steering, which improves the precision of the current limiting since the soft voltage to current characteristics of a semiconductor junction are not used. The current steering mechanism also minimizes temperature sensitivity. Maximum and minimum current limits are provided which are easily programmable by varying the value of two current references. Due to the all NPN design the signal limiter achieves maximum frequency response. Finally, the signal limiter may be used in either single ended or differential amplifiers without inversion of the signal current.

While I have shown and described the preferred embodiment of my invention, it will be apparent to those skilled in the art that many changes and modifications may be made without departing from the invention in its broader aspects. The appended claims therefore cover all such changes and modifications as fall therewithin.

I claim:

1. A current limiter comprising:

a. a transistor having a base, a collector, and an emitter, the collector providing the output current, the base being coupled to a reference voltage source;
   b. a series diode having an anode and a cathode, the anode being coupled to the emitter of said transistor to form a port for receiving a trickle current; and
   c. a diode switching matrix coupled to the cathode of said series diode and coupled to the reference voltage source, said diode switching matrix having ports for receiving first and second reference currents, and an input current.

2. A current limiter as in claim 1 wherein the diode switching matrix comprises first, second, third, and fourth diodes each having an anode and a cathode, the cathode of the first diode being coupled to the anode of the second diode, the cathode of the second diode being coupled to the anode of the third diode and to the cathode of said series diode to form the first reference current port, the cathode of the third diode being coupled to the anode of the fourth diode and to the reference voltage source, and the cathode of the fourth diode being coupled to the anode of the first diode to form both the second reference current port and the input current port.

3. A current limiter as in claim 1 wherein the diode switching matrix comprises first, second, third, and fourth diodes each having an anode and a cathode, the cathode of the first diode being coupled to the anode of the second diode and to to the cathode of said series diode to form the first reference current port, the cathode of the second diode and the anode of the third diode being coupled to the reference voltage source, the cathode of the third diode being coupled to the anode of the fourth diode, the cathode of the fourth diode being coupled to the anode of the first diode to form both the second reference current port and the input current port.

* * * * *